(12) United States Patent
Jo

(10) Patent No.: US 9,831,894 B2
(45) Date of Patent: Nov. 28, 2017

(54) DATA COMPRESSION APPARATUS

(71) Applicant: Electronics and Telecommunications Research Institute, Daejeon (KR)

(72) Inventor: Gweon Do Jo, Daejeon (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 0 days.

(21) Appl. No.: 14/684,698

(22) Filed: Apr. 13, 2015

(65) Prior Publication Data

US 2015/0348231 A1 Dec. 3, 2015

(30) Foreign Application Priority Data

Jun. 2, 2014 (KR) .......................... 10-2014-0066877

(51) Int. Cl.
*H03M 7/30* (2006.01)

(52) U.S. Cl.
CPC ............... *H03M 7/70* (2013.01); *H03M 7/30* (2013.01)

(58) Field of Classification Search
CPC .................................. H03M 7/70; H03M 7/30
USPC ....................................................... 382/298
See application file for complete search history.

(56) References Cited

U.S. PATENT DOCUMENTS

| 8,472,754 B1* | 6/2013 | Harkness ............... H04N 19/86 358/1.2 |
| 9,059,970 B1* | 6/2015 | Joung .................... H03M 7/30 |
| 2009/0290632 A1 | 11/2009 | Wegener |
| 2011/0044297 A1 | 2/2011 | Lee et al. |
| 2011/0099295 A1 | 4/2011 | Wegener |
| 2012/0163458 A1 | 6/2012 | Lee et al. |
| 2013/0294522 A1 | 11/2013 | Lim et al. |

FOREIGN PATENT DOCUMENTS

KR 10-2011-0020195 A 3/2011

OTHER PUBLICATIONS

D. Samardzija, et al., "Compressed Transport of Baseband Signals in Radio Access Networks," IEEE Transactions on Wireless Communications, vol. 11, No. 9, Sep. 2012, pp. 3216-3225.

* cited by examiner

*Primary Examiner* — Amandeep Saini
(74) *Attorney, Agent, or Firm* — NSIP Law

(57) ABSTRACT

Provided is a data compression apparatus. The data compression apparatus includes a header information extraction extracting block header information on compressed data from I/Q data block generated by dividing data on a block basis, a block scaling unit generating an I/Q data scaling block by performing block scaling on the I/Q data block based on the block header information, and a compressed data generation unit generating compressed data by using a block header based on the block header information and the I/Q data scaling block.

19 Claims, 12 Drawing Sheets

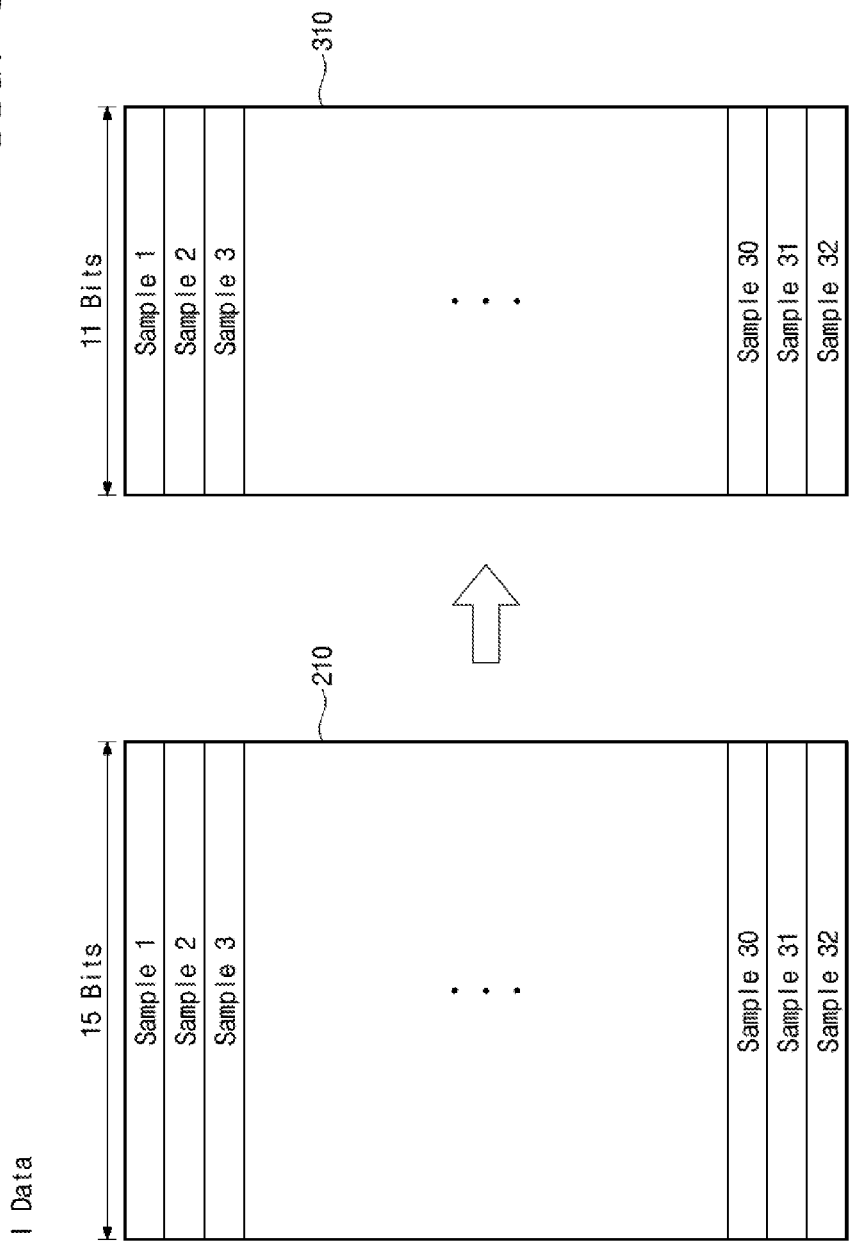

DATA COMPRESSION APPARATUS

CROSS-REFERENCE TO RELATED APPLICATIONS

This U.S. non-provisional patent application claims priority under 35 U.S.C. §119 of Korean Patent Application No. 10-2014-0066877, filed on Jun. 2, 2014, the entire contents of which are hereby incorporated by reference.

BACKGROUND OF THE INVENTION

The present invention disclosed herein relates to a data compression apparatus, and more particularly, to a data compression apparatus compressing data through block scaling.

There is a data compression technology as a technology for increasing data transmission efficiency. As such, when original data is compressed and size-decreased, compressed data is thus transmitted, it is possible to save resources consumed for data transmission.

For example, data compression used in a mobile communication system that uses a long term evolution (LTE) technology is discussed. As a base station of the mobile communication system evolves from an integral base station into a distributed base station, it includes a remote radio head (RRH) and a based band unit (BBU).

The RRH converts a baseband signal into an RF signal to transmit the RF signal, and converts a received RF signal into the baseband signal. Also, the BBU processes the baseband signal and exchanges information with the RRH in order to communicate with mobile terminals.

In this case, an optical cable is mostly used for a connection between the RRH and the BBU, a lot of costs are needed for laying additional optical cables. Also, the number of necessary antennas has increased due to introduction of a multiple input multiple output technology, and the amount of data to be exchanged through an optical cable is also increasing due to an increase in the number of antennas. As such, various data compression technologies for decreasing the size of data in order to decrease a waste of resources such as optical cables are being proposed.

One of such compression technologies includes a block scaling technique. Such a block scaling technique divides data on a block basis, compresses block-based data and transmits compressed data. However, there is a limitation in that such a block scaling technique is set with a fixed block size and thus a transmission delay increases with an increase in set block size.

SUMMARY OF THE INVENTION

The present invention provides a data compression apparatus that compresses data into a block size minimizing an increase in transmission delay.

Embodiments of the present invention provide data compression apparatuses including: a data storage unit storing received in-phase (I) data and quadrature (Q) data, dividing and outputting each of stored I data and Q data on a block basis; a header information extraction unit extracting block header information by using a maximum value obtained from an I data block and Q data block generated by dividing the I data and Q data on the block basis and predetermined padding data; a block scaling unit generating an I data scaling block and Q data scaling block obtained by performing block-scaling on the I data block and Q data block based on the block header information; and a compressed data generation unit generating compressed data by using a block header based on the block header information, the I data scaling block, and the Q data scaling block.

In some embodiments, the header information extraction unit may include: a maximum-size sample determination unit determining a maximum among absolute values of samples in the I data block and Q data block; and a header information generation unit generating the block header information from the maximum value by using a number of bits of the padding data.

In other embodiments, the block header information may be generated by Equation below:

$$G(k) = \left\lfloor \frac{A(k)}{2^{Q_d}} \right\rfloor$$

where $G(k)$ denotes the block header information, $A(k)$ denotes the maximum value, and $Q_d$ denotes the number of bits of the padding data.

In still other embodiments, the number of bits of the padding data may be obtained by subtracting a number of bits allocated to the block header and 1 from a maximum number of bits usable for the I data block and Q data block.

In even other embodiments, the block scaling unit may include: a scaling determination unit determining a block scaling value for scaling of the I data block and Q data block based on the block header information; and a scaling block generation unit operating the I data block and Q data block with the block scaling value to generate the I data scaling block and Q data scaling block.

In yet other embodiments, the block scaling value may be determined by Equation below:

$$\frac{2^{Q_q-1} - 1}{2^{Q_d}(G(k) + 1) - 1}$$

where $G(k)$ denotes the block header information, $Q_d$ denotes a number of bits of the padding data, and $Q_q$ denotes a number of bits to be allocated to samples after the block scaling.

In other embodiments of the present invention, data compression apparatuses include: a data division unit dividing received data into I data and Q data; a first storage unit storing the I data, dividing and outputting stored I data on a block basis; a first header information extraction unit extracting first block header information by using a first maximum value obtained from the I data block generated by dividing the I data on the block basis and first padding data predetermined; a first block scaling unit generating an I data scaling block obtained by performing block scaling on the I data block based on the first block header information; a second storage unit storing the Q data, dividing and outputting stored Q data on a block basis; a second header information extraction unit extracting second block header information by using a second maximum value obtained from the Q data block generated by dividing the Q data on the block basis and second padding data predetermined; a second block scaling unit generating a Q data scaling block obtained by performing block scaling on the Q data block based on the second block header information; and a compressed data generation unit generating compressed data by using the I block header corresponding to the first block header information, the Q block header corresponding to the second block header information, the I data scaling block and the Q data scaling block.

In some embodiments, the first header information extraction unit may include: a first maximum-size sample determination unit determining the first maximum value among absolute values of samples in the I data block; and a first header information generation unit generating the first block header information by using the first maximum value and a number of bits of the first padding data.

In other embodiments, the first block header information may be generated by Equation below:

$$G_I(k) = \left\lfloor \frac{A_I(k)}{2^{Q_{di}}} \right\rfloor$$

where $G_I(k)$ denotes the first block header information, $A_I(k)$ denotes the first maximum value, and $Q_{di}$ denotes the number of bits of the first padding data.

In still other embodiments, the number of bits of the first padding data may be obtained by subtracting a number of bits allocated to the first block header and 1 from a maximum number of bits usable for the I data block.

In even other embodiments, the first block scaling unit may include: a first scaling determination unit determining a first block scaling value for scaling of the I data block based on the first block header information; and a first scaling block generation unit generating the I data scaling block by operating the I data block with the first block scaling value.

In yet other embodiments, the first block scaling value may be determined by Equation below:

$$\frac{2^{Q_q-1}-1}{2^{Q_{di}(G_I(k)+1)}-1}$$

where $G_I(k)$ denotes the first block header information, $Q_{di}$ denotes a number of bits of the first padding data, and $Q_q$ denotes a number of bits to be allocated to samples after the block scaling.

In further embodiments, the second header information extraction unit may include: a second maximum-size sample determination unit determining the second maximum value among absolute values of samples in the Q data block; and a second header information generation unit generating the second block header information by using the second maximum value and a number of bits of the second padding data.

In still further embodiments, the second block header information may be generated by Equation below:

$$G_Q(k) = \left\lfloor \frac{A_Q(k)}{2^{Q_{dq}}} \right\rfloor$$

where $G_Q(k)$ denotes the second block header information, $A_Q(k)$ denotes the second maximum value, and $Q_{dq}$ denotes the number of bits of the second padding data.

In even further embodiments, the number of bits of the second padding data may be obtained by subtracting a number of bits allocated to the second block header and 1 from a maximum number of bits usable for the Q data block.

In yet further embodiments, the second block scaling unit may include: a second scaling determination unit determining a second block scaling value for scaling of the Q data block based on the second block header information; and a second scaling block generation unit generating the Q data scaling block by operating the Q data block with the second block scaling value.

In much further embodiments, the second block scaling value may be determined by Equation below:

$$\frac{2^{Q_q-1}-1}{2^{Q_{dq}(G_Q(k)+1)}-1}$$

where $G_Q(k)$ denotes the second block header information, $Q_{dq}$ denotes a number of bits of the second padding data, and $Q_q$ denotes a number of bits to be allocated to samples after the block scaling.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings:

FIGS. 5A and 5B are exemplary diagrams of a scaling block obtained through block scaling from a data block according to the present invention;

DETAILED DESCRIPTION OF PREFERRED EMBODIMENTS

Exemplary embodiments of the present invention are described below in detail with reference to the accompanying drawings. It should be noted that only descriptions required for understanding operations according to the present invention are provided below and other descriptions are not provided in order not to obscure the subject matter of the present invention.

A data compression apparatus proposed in the present invention compresses data by using a block scaling technique. The data compression apparatus may be used for data transmission and reception in e.g., a baseband unit (BBU) and remote radio head (RRH) using long term evolution (LTE). The usage of the apparatus in such a mobile communication system is provided for example, and the apparatus may also be utilized in other systems transmitting and receiving data as well as such a mobile communication system.

Figure 1:
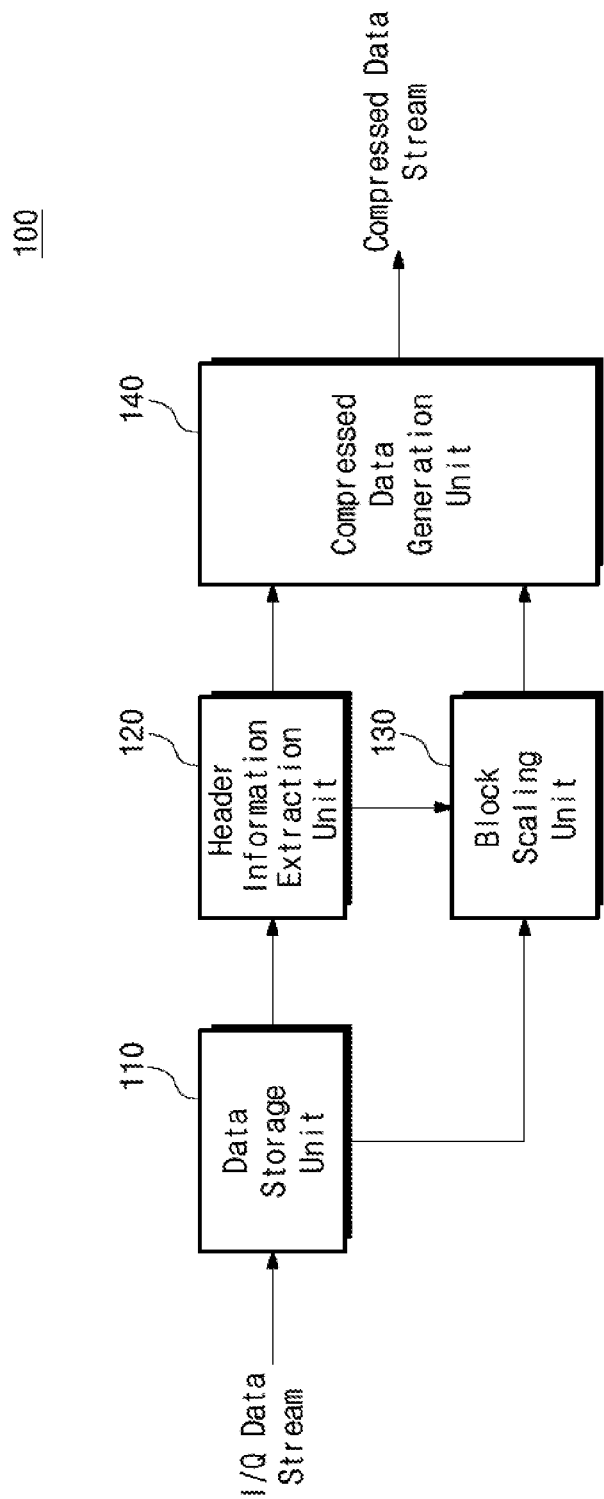
FIG. 1 is an exemplary diagram of a data compression apparatus according to the present invention.

FIG. 1 is an exemplary diagram of a data compression apparatus according to the present invention.

Referring to FIG. 1, a data compression apparatus 100 includes a data storage unit 110, a header information extraction unit 120, a block scaling unit 130, and a compressed data generation unit 140.

The data storage unit 110 stores a received data stream. For example, the data stream includes in-phase (hereinafter, referred to as 'I') data corresponding to a real number component and quadrature-phase (hereinafter, referred to as 'Q') data corresponding to an imaginary number component. Thus, the data stream $S_d(i)$ may be represented by Equation (1) below:

$$S_d(i)=I(i)+jQ(i) \tag{1}$$

where i denotes a sample index. I(i) denotes an I data sample and Q(i) denotes a Q data sample.

As such, the data storage unit 110 stores I data and Q data. The data storage unit 110 divides stored I data and Q data on a block basis (I data block and Q data block) and outputs them to the header information extraction unit 120 and the block scaling unit 130, respectively. In this example, each of the I data block and Q data block may include a plurality of samples that includes a predetermined number of bits.

The header information extraction unit 120 receives the I data block and Q data block obtained by diving the I data and Q data on the block basis. The header information extraction unit 120 extracts, block header information to be included in compressed data, from the I data block and Q data block. That is, the block header information extracted by the header information extraction unit 120 is a block header. In this example, the block header information is generated by using the maximum of absolute values among samples configuring the I data block and Q data block and the number of bits of predetermined padding data. The header information extraction unit 120 outputs extracted block header information to both the block scaling unit 130 and the compressed data generation unit 140.

The block scaling unit 130 receives the I data block and Q data block obtained by diving the I data and Q data on the block basis. Also, the block scaling unit 130 receives block header information. The block scaling unit 130 uses the block header information and padding data to perform block scale on the I data block and Q data block. Accordingly, the block scaling unit 130 generates an I data scaling block and a Q data scaling block. In this example, a generated I data scaling block and Q data scaling block decreases in size in comparison to the I data block and Q data block, due to a decrease in the number of bits of samples in a block.

The compressed data generation unit 140 receives the block header information. The block header includes block header information and includes block header information for the decompression of the I data scaling block and Q data scaling block.

Also, the compressed data generation unit 140 receives the I data scaling block and Q data scaling block. The compressed data generation unit 140 combines the block header, I data scaling block and Q data scaling block to generate a compressed data stream. The compressed data generation unit 140 outputs a generated, compressed data stream. At a receiving end receiving a compressed data stream, some bits are padded with '1' for decompression when block header information in the block header is extracted. Accordingly, it is possible to decrease the number of bits configuring the block header in comparison to a typical block scaling method.

The block scaling unit 130 of the present invention performs block scaling by using a block header obtained based on the maximum value of samples configuring the I data block and Q data block and predetermined padding data. Accordingly, since the size of a data scaling block (i.e., I data scaling block and Q data scaling block) on which the block scaling is performed may vary on a block basis according to the maximum value of data samples in each block, it is possible to minimize a transmission delay due to a block size.

In particular, the compressed data generation unit 140 of the present invention may decrease the size of the block header by using the predetermined padding data to generate the data scaling block having a more variable size. Accordingly, the data compression apparatus 100 may minimize the occurrence of a data transmission delay.

Figure 2:
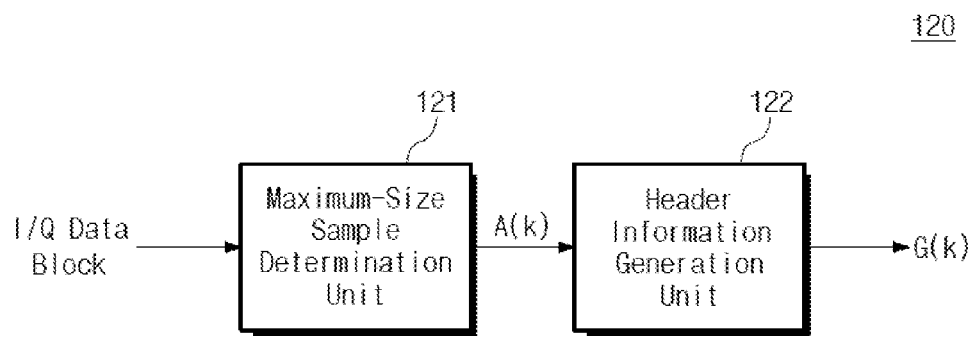
FIG. 2 is an exemplary diagram of a header information extraction unit in FIG. 1.

FIG. 2 is an exemplary diagram of the header information extraction unit in FIG. 1.

Referring to FIG. 2, the header information extraction unit 120 includes a maximum-size sample determination unit 121 and a header information generation unit 122.

The maximum-size sample determination unit 121 receives the I data block and Q data block. The maximum-size sample determination unit 121 calculates absolute values of both samples in the I data block and samples in the Q data block. Then, the maximum-size sample determination unit 121 determines a maximum value A(k) among samples on which the absolute values are calculated. The maximum-size sample determination unit 121 outputs a determined maximum value A(k) to the header information generation unit 122.

The header information generation unit 122 generates block header information G(k) based on a received maximum value A(k). The generation of the block header information by the header information generation unit 122 may be represented by Equation (2) below:

$$G(k) = \left\lfloor \frac{A(k)}{2^{Q_d}} \right\rfloor \tag{2}$$

where A(k) represents the maximum value among absolute values of samples configuring the I data block and Q data block. For example, k may be block index. Also, $Q_d$ is the number of bits of predetermined padding data. In this example, the block header information G(k) may be obtained by dividing A(k) by $2^{Q_d}$ and then performing borrowing. The number of bits of padding data ($Q_d$) may be represented by Equation (3) below:

$$Q_d=Q_a-Q_s-1 \tag{3}$$

where $Q_a$ denotes the maximum number of bits accepted to be capable of being used for expressing an I value and Q value in samples of the I data block and Q data block. $Q_s$ denotes the number of bits allocated to represent a block header. For example, $Q_a$ and $Q_s$ may be predetermined. As such, the header information generation unit 122 may be obtained by subtracting the number of bits $Q_s$ allocated to the block header and 1 from the maximum number of bits $Q_a$ capable of being used for the I data block and Q data block in order to generate the number of bits $Q_d$ of padding data.

That is, the header information generation unit 122 removes the less significant $Q_d$ bit of A(k) and then selects remaining less significant $Q_s$ bit to determine it as a G(k) value. Accordingly, the header information generation unit 122 outputs generated block header information G(k), i.e., block header to both the block scaling unit 130 and the compressed data generation unit 140.

Figure 3:
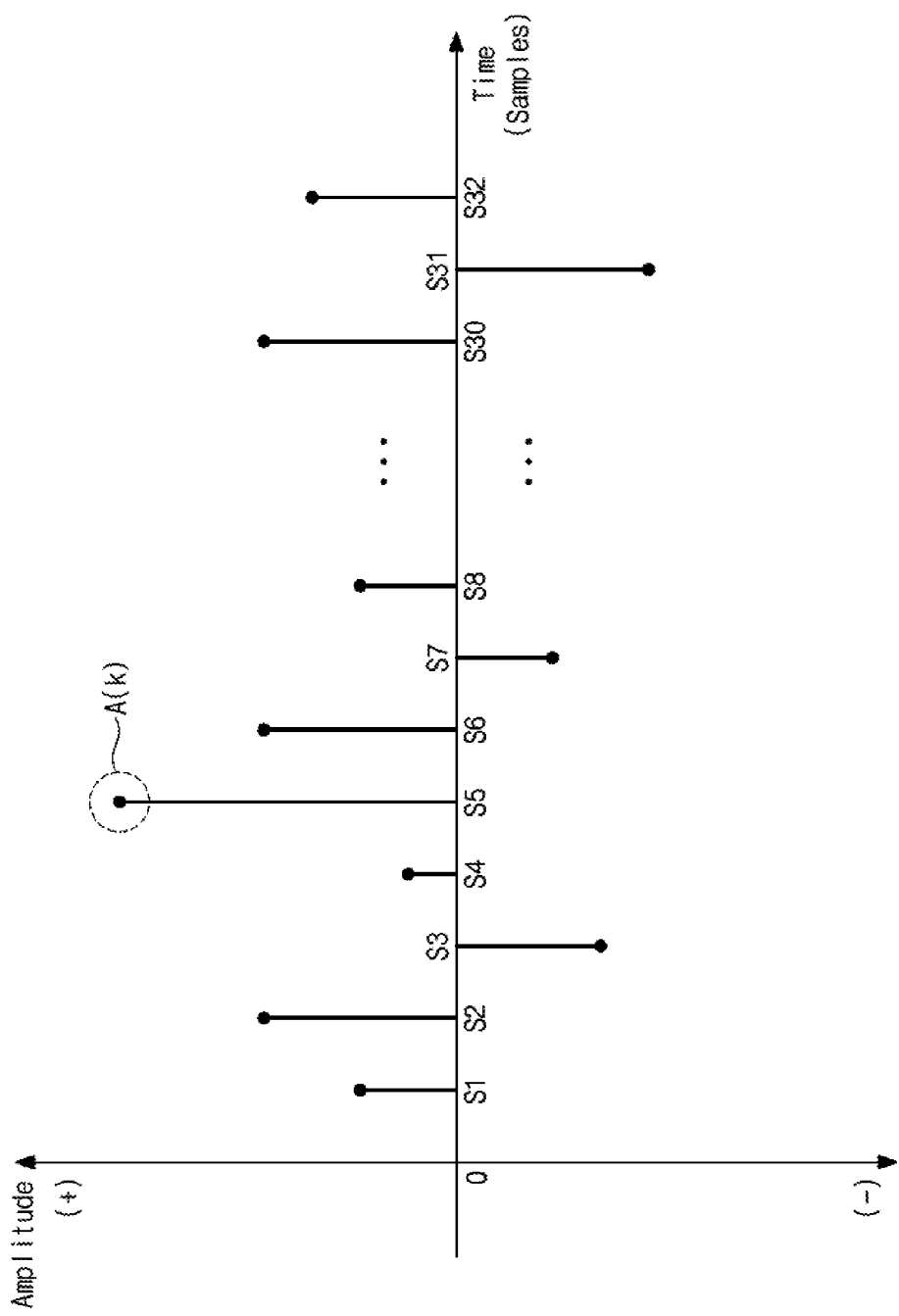
FIG. 3 is a graph showing the amplitude of samples in a data block according to the present invention.

FIG. 3 is a graph showing the amplitude of samples in a data block according to the present invention.

Referring to FIG. 3, samples in the graph may be samples of the I data block or samples of the Q data block. The vertical axis on the graph represents amplitude and the horizontal axis on the graph represents samples depending on the time.

The maximum-size sample determination unit 121 determines the maximum value A(k) of absolute values of samples of the I data block and Q data block. The maximum-size sample determination unit 121 may determine the value of sample S5 as the maximum value A(k), because the value of sample S5 in the I data block and Q data block has the maximum value.

Although the amplitude of samples of a single data block (I data block (or Q data block)) is shown in this example for the convenience of description, the maximum-size sample determination unit 121 determines the maximum value A(k) above in further consideration of samples of another data block (Q data block (or I data block)) (not shown).

Figure 4:
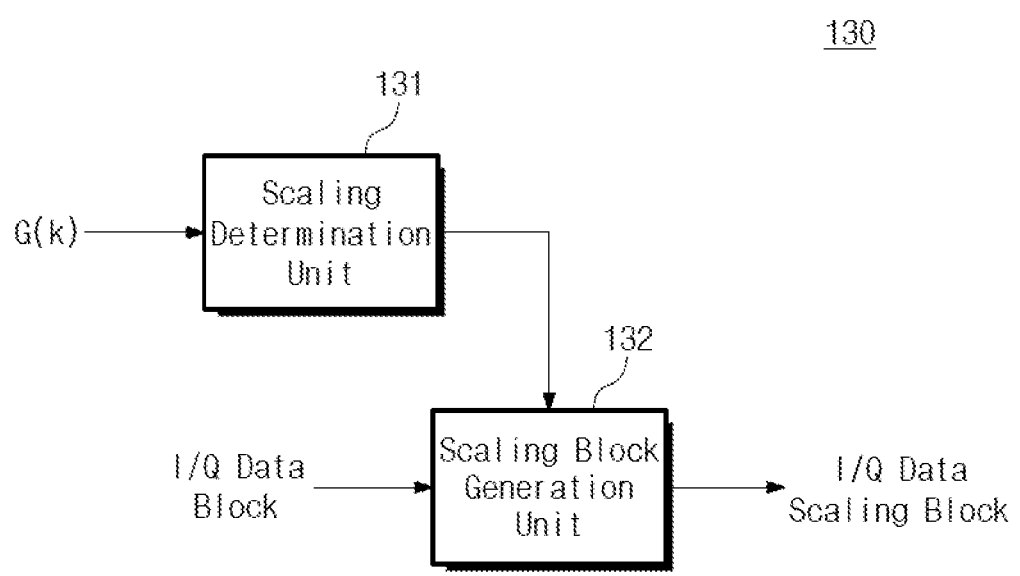
FIG. 4 is an exemplary diagram of a block scaling unit in FIG. 1.

FIG. 4 is an exemplary diagram of a block scaling unit in FIG. 1.

Referring to FIG. 4, the block scaling unit 130 includes the scaling determination unit 131 and the scaling block generation unit 132.

The scaling determination unit 131 determines a block scaling value for the scaling of the I data block and Q data block based on the block header information G(k). The scaling determination unit 131 may determine a block scaling value $S_{ca}$ by using Equation (4) below:

$$S_{ca} = \frac{2^{Qq-1} - 1}{2^{Qd}(G(k) + 1) - 1} \quad (4)$$

where $Q_q$ denotes the number of bits to be allocated to samples after block scaling, and G(k) denotes block header information. $Q_d$ is the number of bits of predetermined padding data.

In this example, the denominator of the block scaling value $S_{ca}$ is a value obtained by performing shift-left by $Q_d$ bit on the binary value of G(k) and then filling all less significant $Q_d$ bits with e.g., 1. Also, the numerator of the block scaling value $S_{ca}$ is a maximum value (all bits have a value of '1') that may be expressed by $Q_q$–1.

The scaling block generation unit 132 receives the I data block and Q data block. The scaling block generation unit 132 receives the block scaling value $S_{ca}$ to perform block scaling on both the I data block and Q data block.

In this example, the block scaling operation is represented by Equation (5) below:

$$S_s(i)S_d(i) \frac{2^{Qq-1} - 1}{2^{Qd}(G(k) + 1) - 1} \quad (5)$$

where $S_d(i)$ denotes the I data block and Q data block and $S_s(i)$ denotes a scaled data block. Also, i may be represented by $N_s k, \ldots, N_s(k+1)-1$.

Thus, the scaling block generation unit 132 multiplies the I/Q data block by the block scaling value $S_{ca}$ to generate an I data scaling block and a Q data scaling block. In this case, the scaling block generation unit 132 rounds off the numbers below decimal point from values obtained through multiplication. In this example, the rounding off is described for example and $S_s(i)$ may also perform carrying or borrowing to convert a determined real number into an integer. A receiving end may decompress a compressed signal by using $S_s(i)$ and G(k).

The scaling block generation unit 132 outputs a generated I data scaling block and Q data scaling block to the compressed data generation unit 140.

Figure 5B:
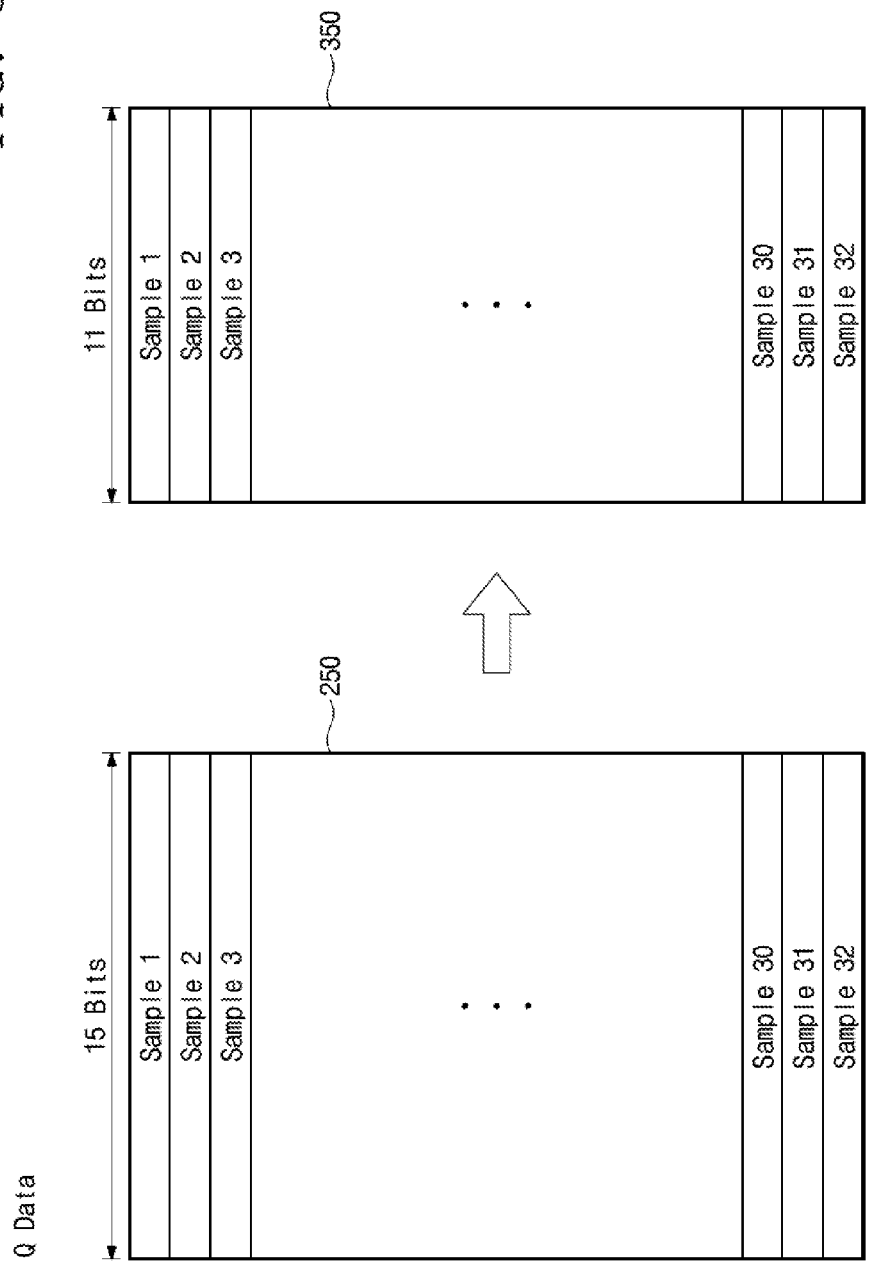

FIGS. 5A and 5B are exemplary diagrams of scaling blocks obtained through block scaling from a data block according to the present invention.

Referring to FIG. 5A, an I data block 210 is shown. For example, the I data block 210 includes 32 samples. In this example, assume that the maximum number of bits $Q_a$ that each of samples may have is 15. In this case, one bit may be used as a sign bit, and remaining 14 bits may be used as information bits.

Therefore, a value that each of samples may represent may have a value ranging from $-2^{14}$ to $2^{14}-1$.

An I data scaling block 310 obtained by block-scaling the I data block 210 by the scaling block generation unit 132 is shown.

The I data scaling block 310 includes 32 samples. For example, each sample is compressed into 11 bits through the block scaling operation. In this case, one bit is a sign bit and remaining 10 bits may be used as information bits. Therefore, a value that each of samples may represent may have a value ranging from $-2^{10}$ to $2^{10}-1$.

Referring to FIG. 5B, a Q data block 250 is shown. For example, the Q data block 250 includes 32 samples. In this example, assume that the maximum number of bits $Q_a$ that each of samples may have is 15. In this case, one bit may be used as a sign bit, and remaining 14 bits may be used as information bits.

Therefore, a value that each of samples may represent may have a value ranging from $-2^{14}$ to $2^{14}-1$.

A Q data scaling block 350 obtained by block-scaling the Q data block 250 by the scaling block generation unit 132 is shown.

The Q data scaling block 310 includes 32 samples. For example, each sample is compressed into 11 bits through the block scaling operation. In this case, one bit is a sign bit and remaining 10 bits may be used as information bits.

Therefore, a value that each of samples may represent may have a value ranging from $-2^{10}$ to $2^{10}-1$.

In FIGS. 5A and 5B, the $Q_q$ value in Equations (4) and (5) may be 11.

As such, the block scaling operation of the present invention performs block scaling by using the block header information G(k) obtained based on the maximum value A(k) of the I data block and Q data block. Therefore, the I data and Q data may be compressed by performing block scaling on input I data and Q data with the block scaling value $S_{ca}$ calculated by using the bock header information G(k).

Figure 6:
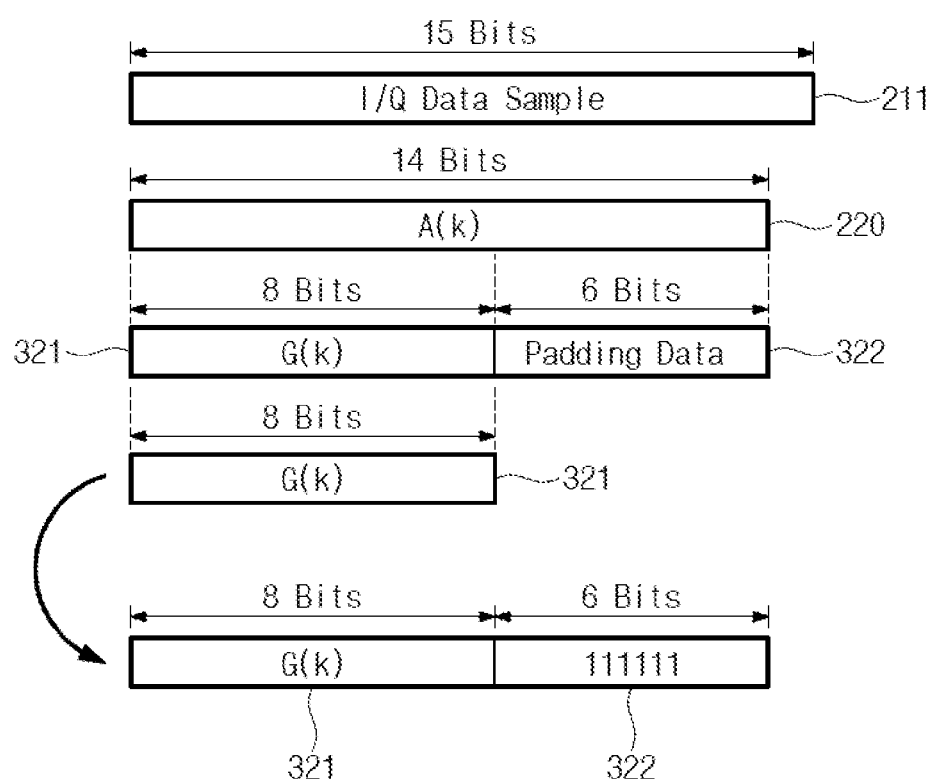
FIG. 6 is an exemplary diagram of a block header in compressed data according to the present invention.

FIG. 6 is an exemplary diagram of a block header in compressed data according to the present invention.

Referring to FIG. 6, an I data sample or Q data sample 211 may include 15 bits. In this example, assume that the maximum value A(k) of the absolute values of samples is 14.

In this case, the block header 321 may be used by using information obtained based on Equation (2). For example, when $Q_a$ is 15 and $Q_q$ is 11, it is possible to set $Q_s$ to 8. In this case, $Q_d$ may be set to 6 (15−8−1) by Equation (4). Thus, when A(k)(=$2^{14}$) having a value of 14 bits ($Q_a$−1) is divided by $2Q_d$=26) by Equation (2), it is possible to obtain G(k) having a value of 28. Accordingly, the block header information G(k) may be set to 8 bits.

Information used for data compression and decompression through block scaling includes the block header 321 and padding data 322.

Thus, the block header 321 of the present invention may include the block header information G(k) and include 8 bits. As the block header 321 includes 8 bits, all of 6-bit padding data (padding bits) 322 may be set to '1' for block scaling to be used for the block scaling operation.

Also, even when the block header 321 of the present invention is received for decompression, all of padding data (e.g., 6 bits) is padded with '1' and then decompressed.

Referring to FIGS. 5A to 6 above, it is assumed that $N_s$ represents a value of a 32-bit sample. In this case, each of I/Q data samples 211 may represent 15 bits ($Q_a$). In this case, assume that each of the I data block and Q data block is compressed into 11 bits, and 16 bits ($Q_s$) are allocated to one block header.

The total number of bits of compressed information may be calculated by Equation (6) below:

$$Q_s + 2N_sQ_n = 16 + 2*32*11 = 720 \quad (6)$$

However, assume that the same compressibility is considered when the size of a block decreases to the half in order to decrease a transmission delay. In this case, the total number of bits of compressed information may be calculated by Equation (7) below:

$$\frac{Q_s + 2N_sQ_q}{2} = 360. \quad (7)$$

When the size of a block decreases to the half, $N_s$ and $Q_s$ should decrease to the halves.

A typical block header needs to include 16 bits but the block header proposed by the present invention may represent 8 bits as described in FIG. 6. Thus, since a block scaling device proposed by the present invention may decrease the size of a header, it is possible to further decrease the size of a block.

Figure 7:
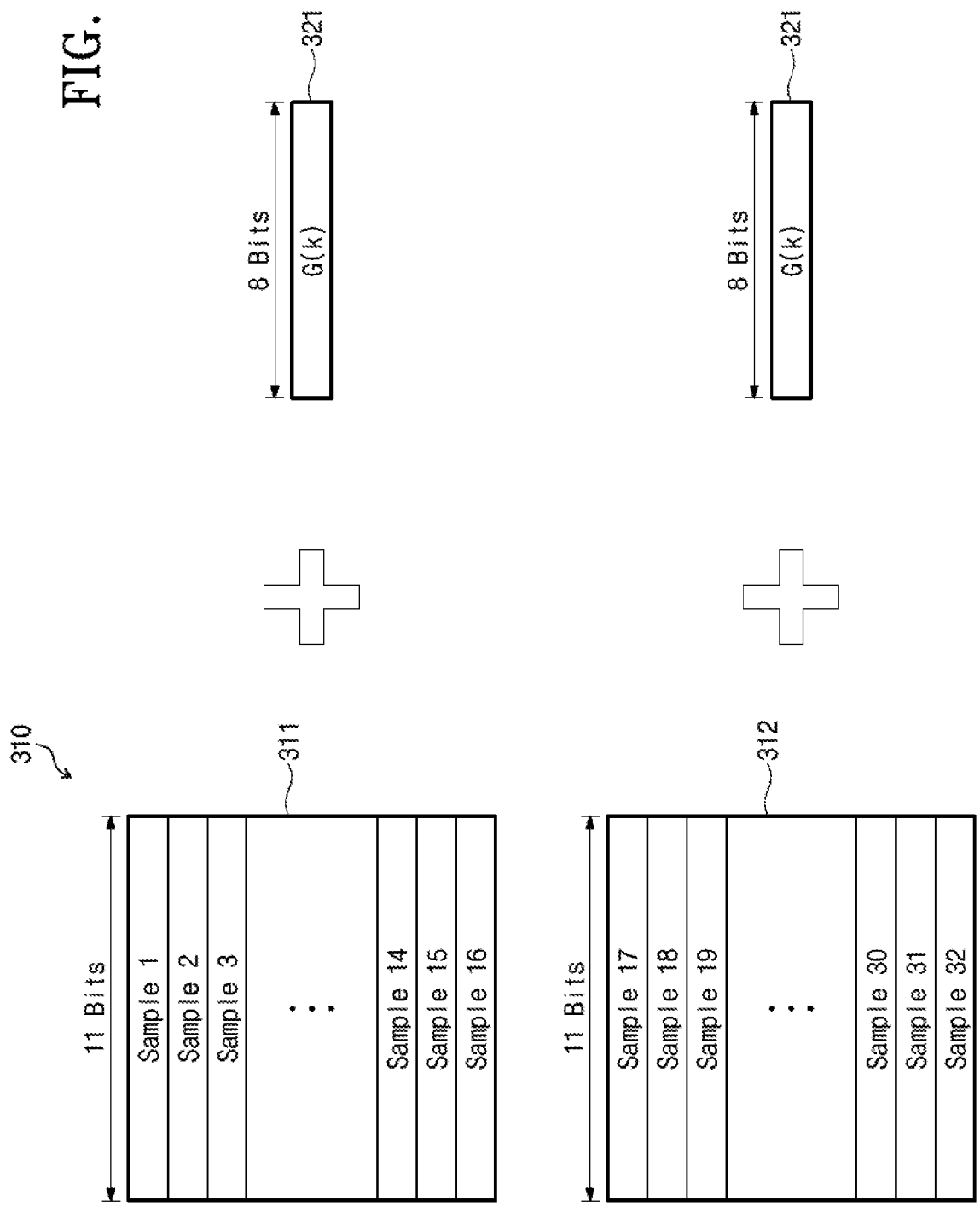
FIG. 7 is an exemplary diagram of an operation of decreasing the size of a data block by using a block header according to the present invention.

FIG. 7 is an exemplary diagram of an operation of decreasing the size of a data block by using a block header according to the present invention.

Referring to FIG. 7, the compressed data generation unit 140 may divide the data block 310 compressed through block scaling in half to decrease the size of a block, for example.

One data block 310 is divided into a first data block 311 and a second data block 312 by the compressed data generation unit 140. In this example, the data block may be the I data block or Q data block. The first data block 311 may include first to sixteenth samples and the second data block 312 may include seventeenth to thirty second samples.

When transmitting the first data block 311 and the second data block 312, the compressed data generation unit 140 may transmit them along with the block header 321 as described in FIG. 6 for decompression or expanding.

As such, the compressed data generation unit 140 may use the block header to decrease the size of a data scaling block. As the A(k) value obtained from the header information extraction unit 120 through a decreased data block is obtained from a data block having a decreased number of samples, a further decrease in the size of a data scaling block is possible.

In particular, a receiving end receiving data through the data compression apparatus 100 proposed may decrease a data transmission delay due to a decrease in block size.

This example shows for the convenience of description that one of the I data block and Q data block is divided. However, it is also possible to equally divide the other data block.

Figure 8:
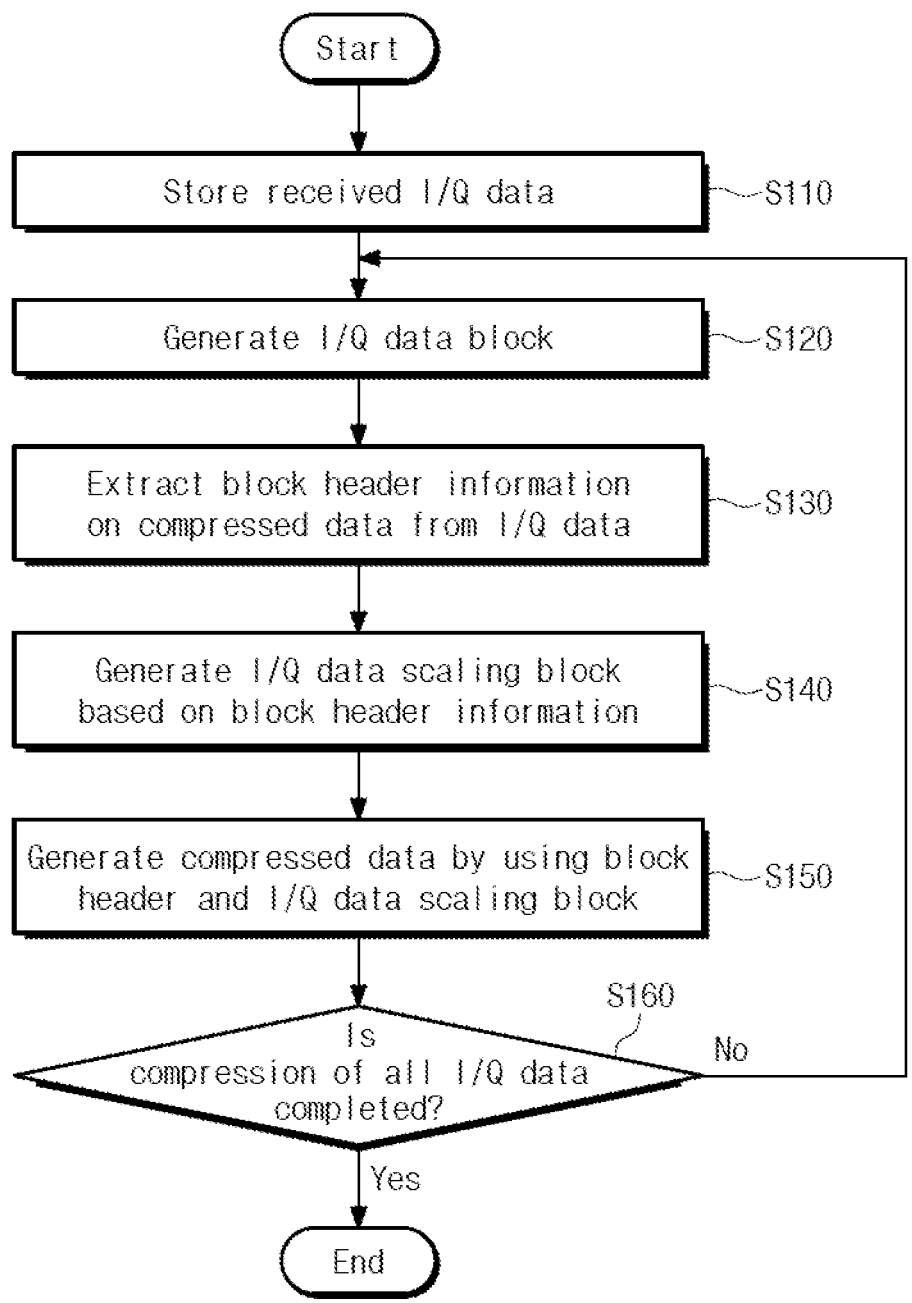
FIG. 8 is an exemplary flowchart of a data compression operation of the data compression apparatus in FIG. 1.

FIG. 8 is an exemplary flowchart of a data compression operation of the data compression apparatus in FIG. 1.

Referring to FIG. 8, the data storage unit 110 stores received I data and Q data in step S110. In this case, the I data and Q data may be received in the form of a data stream.

The data storage unit 110 generates the I data block and Q data block by dividing the I data and Q data on a block basis in step S120. The data storage unit 110 outputs the I data block and Q data block to the header information extraction unit 120 and block scaling unit 130.

The header information extraction unit 120 receives the I data block and Q data block and extracts block header information by using predetermined padding data from a maximum value obtained from the I data block and Q data block, in step S130. In this example, padding data is data padded along with the block header in data compression operation or decompression operation through block scaling. The block header information may be obtained through Equation (2). Accordingly, the header information extraction unit 120 may obtain the block header information. In this example, the block header information is information in the block header. Thus, the header information extraction unit 120 outputs the block header information, i.e., block header to the block scaling unit 130 and the compressed data generation unit 140.

The block scaling unit 130 uses a block scaling value to perform block scaling on the I data block and Q data block to generate an I data scaling block and Q data scaling block in step S140. In this case, the block scaling unit 130 uses the block header information received from the header information extraction unit 120 to calculate the block scaling value. The block scaling unit 130 outputs a block-scaled I data scaling block and Q data scaling block to the compressed data generation unit 140.

The compressed data generation unit 140 uses the block header, I data scaling block and Q data scaling block to generate compressed data in step S150. In this case, the compressed data may have the form of a compressed data stream.

The compressed data generation unit 140 determines whether the compression of all of I data and Q data has been completed in step S160.

When as a result of determination in step S160, the compression of all of I data and Q data has been completed, processing ends. However, when as the result of determination in step S160, the compression of all of I data and Q data has not been completed, processing proceeds to step S120 to generate the next I data block and Q data block.

Accordingly, the present invention has a high probability that there is a big difference between a large value and a small value among samples in the I block and Q block when the size of the block is large. Since the principle that a signal in a block is scaled based on a large value is used, a phenomenon in which a signal having a small value is lost due to the large value occurs. Such a signal loss distorts a signal. Thus, the present invention may decrease a limitation in signal distortion through a header structure that may decrease the size of a block.

Statistically, an I signal and Q signal may be considered as independent signals. Therefore, there is no guarantee that the maximum absolute value of samples in the Q data block is large when the maximum absolute value of samples in the I data block in a block is large. Thus, when there is a big difference in the maximum absolute value of samples between the I data block and Q data block, a signal having a small value may be lost because block scaling is performed based on a large value. Thus, when the block scaling values of the I data block and Q data block are separately applied, it is possible to further decrease signal distortion in comparison to when the same block scaling value is applied to the I data block and Q data block.

The structure of a data compression apparatus to which a block scaling value is separately applied is described below.

Figure 9:
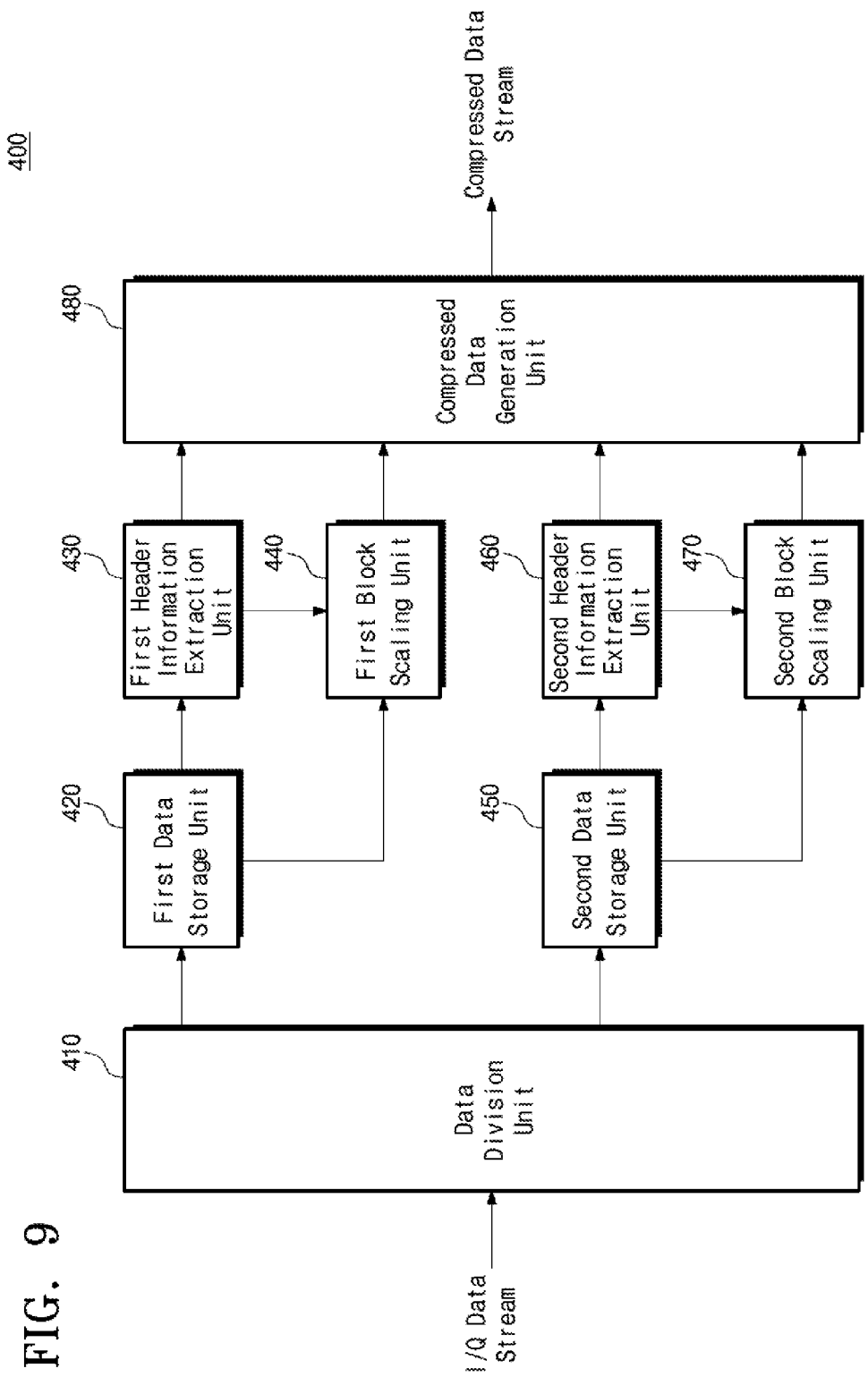
FIG. 9 is an exemplary diagram of a data compression apparatus according to the present invention.

FIG. 9 is an exemplary diagram of a data compression apparatus according to another embodiment of the present invention.

Referring to FIG. 9, a data compression apparatus 400 includes a data division unit 410, a first data storage unit 420, a first header information extraction unit 430, a first block scaling unit 440, a second data storage unit 450, a second header information extraction unit 460, a second block scaling unit 470, and a compressed data generation unit 480.

The data division unit 410 divides I data and Q data from a received data stream. The data division unit 410 outputs I data to the first data storage unit 420 and outputs Q data to the second data storage unit 450.

The first data storage unit 420 stores I data. The first data storage unit 420 divides stored I data on a block basis (I data block) and outputs the data to both the first header information extraction unit 430 and the first block scaling unit 440.

The first header information extraction unit 430 receives the I data block obtained by diving the I data on the block basis. The first header information extraction unit 430 extracts first block header information to be included in compressed data from the I data block. In this example, the first block header information is generated by using the maximum of absolute values among samples configuring the I data block and the number of bits of predetermined padding data. The first header information extraction unit 430 outputs extracted first block header information, i.e., first block header to both the first block scaling unit 440 and the compressed data generation unit 480.

The first block scaling unit 440 receives the I data block obtained by diving the I data on the block basis. Also, the first block scaling unit 440 receives the first block header information. The first block scaling unit 440 uses the first block header information and padding data to perform block scaling on the I data block. Accordingly, the first block scaling unit 440 generates an I data scaling block. In this example, a generated I data scaling block decreases in size in comparison to the I data block, due to a decrease in the number of bits of samples in the I data scaling block.

The second data storage unit 450 stores Q data. The second data storage unit 450 divides stored Q data on a block basis (Q data block) and outputs the data to both the second header information extraction unit 460 and the second block scaling unit 470.

The second header information extraction unit 460 receives the Q data block by dividing the Q data on the block basis. The second header information extraction unit 460 extracts second block header information to be included in compressed data from the Q data block. In this example, the second block header information is generated by using the maximum of absolute values among samples configuring the Q data block and the number of bits of predetermined padding data. The second header information extraction unit 460 outputs extracted second block header information, i.e., second block header to both the second block scaling unit 470 and the compressed data generation unit 480.

The second block scaling unit 470 receives the Q data block by dividing the Q data on the block basis. Also, the second block scaling unit 470 receives second block header information. The second block scaling unit 470 uses the second block header information and padding data to perform block scaling on the Q data block. Accordingly, the second block scaling unit 470 generates a Q data scaling block. In this example, a generated Q data scaling block decreases in size in comparison to the Q data block, due to a decrease in the number of bits of samples in the Q data scaling block.

The compressed data generation unit 480 receives first block header information. The first block header information is information in the first block header. In this example, the first block header includes block scaling information for the decompression of an I data scaling block. The compressed data generation unit 480 receives the second block header information. The second block header information is information in a second block header. The second block header includes block scaling information for the decompression of the second data scaling block.

Also, the compressed data generation unit 480 receives the I data scaling block and Q data scaling block.

Accordingly, the compressed data generation unit 480 combines the first block header, the second block header, the I data scaling block and Q data scaling block to generate a compressed data stream. The compressed data generation unit 480 outputs a generated, compressed data stream.

As such, the data compression apparatus 400 of the present invention may use a structure of independently processing the I signal and Q signal for data compression to decrease signal distortion due to a difference in signal size between I data and Q data.

Figure 10:
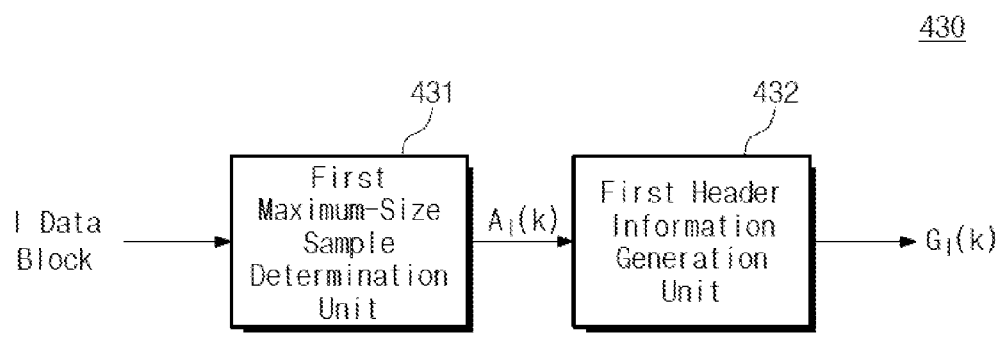
FIG. 10 is an exemplary diagram of a first header information extraction unit in FIG. 9.

FIG. 10 is an exemplary diagram of a first header information extraction unit in FIG. 9.

Referring to FIG. 10, the first header information extraction unit 430 includes a first maximum-size sample determination unit 431 and a first header information generation unit 432.

The first maximum-size sample determination unit 431 receives an I data block. The maximum-size sample determination unit 431 calculates absolute values of each of samples in the I data block. Then, the first maximum-size sample determination unit 431 determines the maximum value $A_I(k)$ among samples on which the absolute values have been calculated. The first maximum-size sample determination unit 431 outputs a determined maximum value $A_I(k)$ to the first header information generation unit 432.

The first header information generation unit 432 generates block header information $G_I(k)$ based on a received maximum value $A_I(k)$. The generation of the block header information by the first header information generation unit 432 may be represented by Equation (8) below:

$$G_I(k) = \left\lfloor \frac{A_I(k)}{2^{Q_{di}}} \right\rfloor \qquad (8)$$

where $A_I(k)$ represents the maximum value among absolute values of samples configuring the I data block and Q data block. Also, $Q_{di}$ is the number of bits of first padding data predetermined. In this example, the block header information $G_I(k)$ may be obtained by dividing $A_I(k)$ by $2^{Q_{di}}$ and then performing borrowing. The number of bits of first padding data ($Q_{di}$) may be represented by Equation (9) below:

$$Q_{di} = Q_a - Q_{si} - 1 \qquad (9)$$

where $Q_a$ denotes the maximum number of bits accepted to be capable of being used for expressing an I value in samples of the I data block. $Q_{si}$ denotes the number of bits allocated to represent a first block header. For example, $Q_a$ and $Q_{si}$ may be predetermined. As such, the first header information generation unit 432 may be obtained by subtracting the number of bits $Q_{si}$ allocated to the first block header and 1 from the maximum number of bits $Q_a$ capable of being used for the I data block or Q data block in order to generate the number of bits $Q_{di}$ of first padding data.

That is, the first header information generation unit 432 removes the less significant $Q_{di}$ bit of $A_I(k)$ and then selects remaining less significant $Q_{si}$ bits to determine it as a $G_I(k)$ value. Accordingly, the first header information generation unit 432 outputs generated first block header information $G_I(k)$, i.e., first block header to both the first block scaling unit 440 and the compressed data generation unit 480.

That is, the first header information generation unit 432 removes the less significant $Q_{di}$ bit of $A_I(k)$ and then selects remaining less significant $Q_{si}$ bits to determine it as a $G_I(k)$ value. Accordingly, the first header information generation unit 432 outputs generated block header information $G_I(k)$ to both the first block scaling unit 440 and the compressed data generation unit 480.

Figure 11:
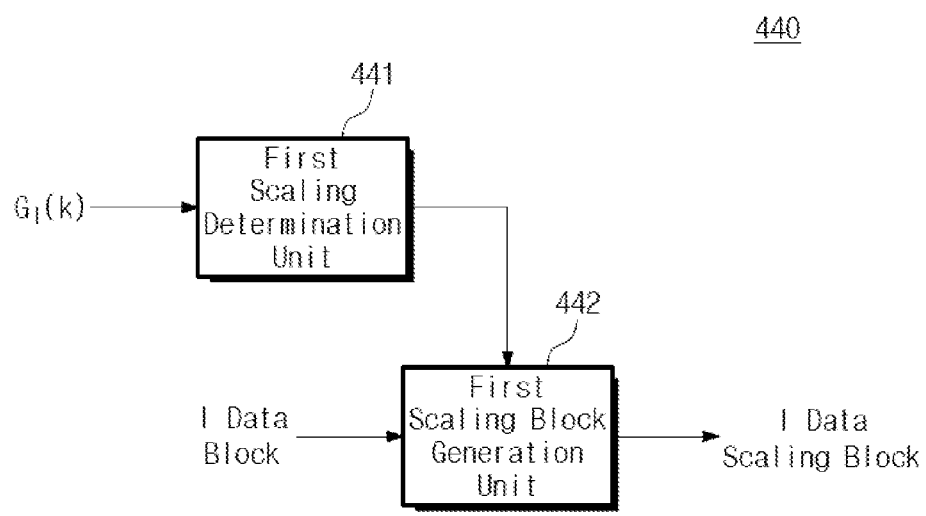
FIG. 11 is an exemplary diagram of a first block scaling unit in FIG. 9.

FIG. 11 is an exemplary diagram of a first block scaling unit in FIG. 9.

Referring to FIG. 11, the first block scaling unit 440 includes a first scaling determination unit 441 and a first scaling block generation unit 442. The first scaling determination unit 441 determines a first block scaling value $S_{cai}$ for the scaling of the I data block based on the block header information $G_I(k)$. The first scaling determination unit 441 may determine the first block scaling value $S_{cai}$ by using Equation (10) below:

$$S_{cai} = \frac{2^{Q_q-1}-1}{2^{Q_{di}}(G_I(k)+1)-1} \qquad (10)$$

where $Q_q$ denotes the number of bits to be allocated to samples after block scaling, and $G_I(k)$ denotes block header information. $Q_{di}$ is the number of bits of first padding data predetermined.

In this example, the denominator of the first block scaling value $S_{cai}$ is a value obtained by performing shift-left by $Q_{di}$ bit on the binary value of $G_I(k)$ and then filling all less significant $Q_{di}$ bits with e.g., 1. Also, the numerator of the first block scaling value $S_{cai}$ is a maximum value (all bits have a value of '1') that may be expressed by ($Q_q$-1) bit.

The first scaling block generation unit 442 receives the I data block. The first scaling block generation unit 442 receives the block scaling value $S_{cai}$ and performs block scaling on the I data block.

In this example, the block scaling operation is represented by Equation (11) below:

$$\text{real}(S_s(i)) = \text{real}(S_d(i)) \frac{2^{Q_q-1}-1}{2^{Q_{di}}(G_I(k)+1)-1} \qquad (11)$$

where real $S_d(i)$ denotes an I data block and real $S_s(i)$ denotes a scaled I data block. Also, i may be represented by $N_s k, \ldots, N_s(k+1)-1$.

Thus, the first scaling block generation unit 442 multiplies the I data block by the block scaling value $S_{cai}$ to generate an I data scaling block. In this case, the first scaling block generation unit 442 rounds off the numbers below decimal point from values obtained through multiplication. In this example, the rounding off is described for example and real $S_s(i)$ may also perform carrying or borrowing to convert a determined real number into an integer. A receiving end may decompress a compressed signal by using real $S_s(i)$ and $G_I(k)$.

The first scaling block generation unit 442 outputs a generated I data scaling block to the compressed data generation unit 480.

Figure 12:
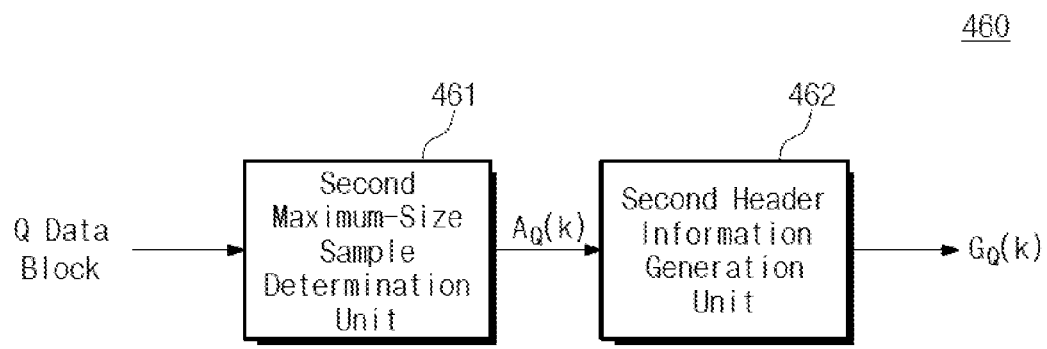
FIG. 12 is an exemplary diagram of a second header information extraction unit in FIG. 9.

FIG. 12 is an exemplary diagram of a second header information extraction unit in FIG. 9.

Referring to FIG. 12, the second header information extraction unit 460 includes a second maximum-size sample determination unit 461 and a second header information generation unit 462.

The second maximum-size sample determination unit 461 receives a Q data block. The maximum-size sample determination unit 461 calculates absolute values of each of samples in the Q data block. Then, the second maximum-size sample determination unit 461 determines the maximum value $A_Q(k)$ among samples on which the absolute values have been calculated. The second maximum-size sample determination unit 461 outputs a determined maximum value $A_Q(k)$ to the second header information generation unit 462.

The second header information generation unit 462 generates block header information GQ(k) based on a received maximum value AQ(k). The generation of the block header information by the second header information generation unit 462 may be represented by Equation (12) below:

$$G_Q(k) = \left\lfloor \frac{A_Q(k)}{2^{Q_{dq}}} \right\rfloor \qquad (12)$$

where $A_Q(k)$ represents the maximum value among absolute values of samples configuring the Q data block. Also, $Q_{dq}$ is the number of bits of second padding data predetermined. In this example, the block header information $G_Q(k)$ may be obtained by dividing $A_Q(k)$ by $2^{Q_{dq}}$ and then performing borrowing. The number of bits of second padding data ($Q_{dq}$) may be represented by Equation (13) below:

$$Q_{dq} = Q_a - Q_{sq} - 1 \qquad (13)$$

where $Q_a$ denotes the maximum number of bits accepted to be capable of being used for expressing a Q value in samples of the Q data block. $Q_{sq}$ denotes the number of bits allocated to represent a second block header. For example, $Q_a$ and $Q_{sq}$ may be predetermined. As such, the second header information generation unit 462 may be obtained by subtracting the number of bits $Q_{sq}$ allocated to the second block header and 1 from the maximum number of bits $Q_a$ capable of being used for the I data block or Q data block in order to generate the number of bits $Q_{dq}$ of second padding data.

That is, the second header information generation unit 462 removes the less significant $Q_{dq}$ bit of $A_Q(k)$ and then selects remaining less significant $Q_{sq}$ bits to determine it as a $G_Q(k)$ value. Accordingly, the second header information generation unit 462 outputs generated second block header information $G_Q(k)$, i.e., second block header to both the second block scaling unit 470 and the compressed data generation unit 480.

Figure 13:
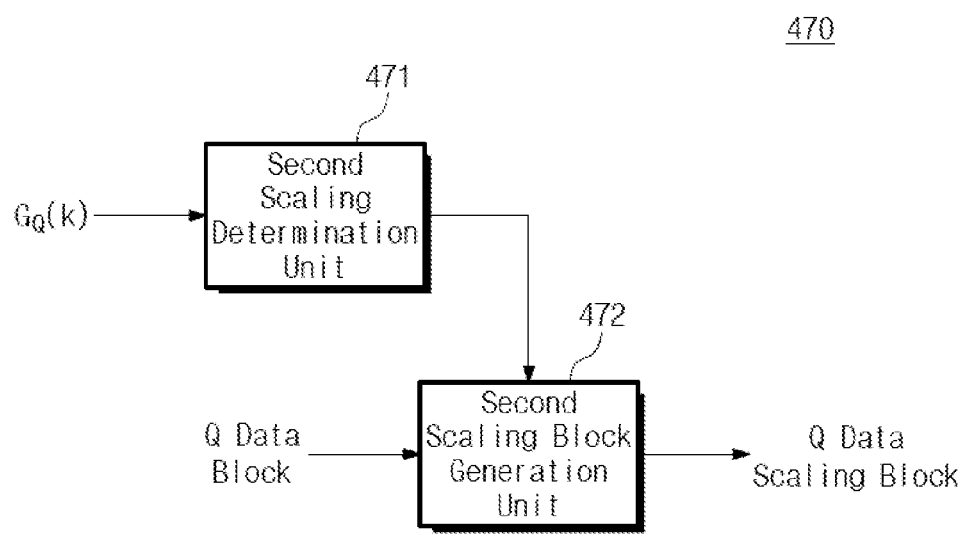
FIG. 13 is an exemplary diagram of a second block scaling unit in FIG. 9.

FIG. 13 is an exemplary diagram of a second block scaling unit in FIG. 9.

Referring to FIG. 13, the second block scaling unit 470 includes a second scaling determination unit 471 and a second scaling block generation unit 472. The second scaling determination unit 471 determines a second block scaling value $S_{caq}$ for the scaling of the Q data block based on the block header information $G_Q(k)$. The second scaling determination unit 471 may determine the second block scaling value $S_{caq}$ by using Equation (14) below:

$$S_{caq} = \frac{2^{Q_q-1} - 1}{2^{Q_{dq}}(G_Q(k) + 1) - 1} \quad (14)$$

where $Q_q$ denotes the number of bits to be allocated to samples after block scaling, and $G_Q(k)$ denotes block header information. $Q_{dq}$ is the number of bits of second padding data predetermined.

In this example, the denominator of the second block scaling value $S_{caq}$ is a value obtained by performing shift-left by $Q_{dq}$ bit on the binary value of $G_Q(k)$ and then filling all less significant $Q_{dq}$ bits with e.g., 1. Also, the numerator of the second block scaling value $S_{caq}$ is a maximum value (all bits have a value of '1') that may be expressed by $(Q_q-1)$ bit.

The second scaling block generation unit 472 receives the Q data block. The second scaling block generation unit 472 receives the block scaling value $S_{caq}$ and performs block scaling on the Q data block.

In this example, the block scaling operation is represented by Equation (15) below:

$$imag(S_s(i)) = imag(S_d(i)) \frac{2^{Q_q-1} - 1}{2^{Q_{dq}}(G_Q(k) + 1) - 1} \quad (15)$$

where imag $S_d(i)$ denotes a Q data block and imag $S_s(i)$ denotes a scaled Q data block. Also, i may be represented by $N_s k, \ldots, N_s(k+1)-1$.

Thus, the second scaling block generation unit 472 multiplies the Q data block by the block scaling value $S_{caq}$ to generate a Q data scaling block. In this case, the second scaling block generation unit 472 rounds off the numbers below decimal point from values obtained through multiplication. In this example, the rounding off is described for example and imag $S_s(i)$ may also perform carrying or borrowing to convert a determined real number into an integer. A receiving end may decompress a compressed signal by using imag $S_s(i)$ and $G_Q(k)$.

The second scaling block generation unit 472 outputs a generated Q data scaling block to the compressed data generation unit 480.

FIGS. 9 to 13 have described the data compression apparatus 400 that performs block scaling on I data and Q data independently. Accordingly, as the I data block and Q data block use different block scaling factors, it is possible to further decrease signal distortion due to a difference between the I data and Q data.

As such, the data compression apparatuses proposed in the present invention may be applied to e.g., the compression and decompression of a communication signal and the compression and decompression of a digital signal as well as to the optical interface between a radio unit (RU) or RRH and a digital unit (DU) or BBU that are the architectures of a distributed base station, and may also be used along with other compression and decompression algorithms.

By decreasing the size of a header in a data compression data block, it is possible to decrease the size of a data block in a compressed data stream and thus minimize the occurrence of a transmission delay While particular embodiments have been described in the detailed description of the present invention, many variations may be made without departing from the scope of the present invention. Therefore, the scope of the present invention should not be limited to the above-described embodiments and should be defined by the following claims and equivalents thereof.

What is claimed is:

1. A data compression apparatus, comprising:
a data storage device configured to store received in-phase (I) data and quadrature (Q) data, and divide and output each of stored I data and Q data on a block basis; and
a processor configured to
extract block header information using a maximum value obtained from an I data block and a Q data block generated by dividing the I data and Q data on the block basis and padding data,
scale an I data scaling block and Q data scaling block obtained by performing block-scaling on the I data block and the Q data block using the block header information, and
generate compressed data using a block header based on the block header information, the I data scaling block, and the Q data scaling block.

2. The data compression apparatus of claim 1, wherein the processor is further configured to
determine a maximum among absolute values of samples in the I data block and the Q data block, and
generate the block header information from the maximum value using a number of bits of the padding data.

3. The data compression apparatus of claim 2, wherein the block header information is determined according to:

$$G(k) = \left\lfloor \frac{A(k)}{2^{Q_d}} \right\rfloor$$

where G(k) denotes the block header information, A(k) denotes the maximum value, and $Q_d$ denotes the number of bits of the padding data.

4. The data compression apparatus of claim 3, wherein the number of bits of the padding data is obtained by subtracting a number of bits allocated to the block header and one from a maximum number of bits usable for the I data block and the Q data block.

5. The data compression apparatus of claim 3, wherein the processor is further configured to
determine a block scaling value for scaling of the I data block and the Q data block using the block header information, and
operate the I data block and Q data block with the block scaling value to generate the I data scaling block and Q data scaling block.

6. The data compression apparatus of claim 4, wherein the block scaling value is determined according to:

$$\frac{2^{Q_q-1}-1}{2^{Q_d(G(k)+1)}-1}$$

where $Q_q$ denotes a number of bits to be allocated to samples after the block scaling.

7. The data compression apparatus of claim 1, wherein the block header information is determined based on a quantity raised to a power of a number of bits of the padding data.

8. A data compression apparatus, comprising:
a first storage device configured to store I data, and divide and output stored I data on a block basis;
a second storage device configured to store Q data, and divide and output stored Q data on a block basis; and
a processor configured to
divide received data into the I data and the Q data,
extract first block header information using a first maximum value obtained from the I data block generated by dividing the I data on the block basis and first padding data,
generate an I data scaling block obtained by performing block scaling on the I data block using the first block header information,
extract second block header information using a second maximum value obtained from the Q data block generated by dividing the Q data on the block basis and second padding data,
generate a Q data scaling block obtained by performing block scaling on the Q data block using the second block header information, and
generate compressed data using the I block header corresponding to the first block header information, the Q block header corresponding to the second block header information, the I data scaling block and the Q data scaling block.

9. The data compression apparatus of claim 8, wherein the processor is further configured to
determine a first maximum value among absolute values of samples in the I data block, and
generate the first block header information using the first maximum value and a number of bits of the first padding data.

10. The data compression apparatus of claim 9, wherein the first block header information is generated according to:

$$G_I(k) = \left\lfloor \frac{A_I(k)}{2^{Q_{di}}} \right\rfloor$$

where $G_I(k)$ denotes the first block header information, $A_I(k)$ denotes the first maximum value, and $Q_{di}$ denotes the number of bits of the first padding data.

11. The data compression apparatus of claim 10, wherein the number of bits of the first padding data is obtained by subtracting a number of bits allocated to the first block header and one from a maximum number of bits usable for the I data block.

12. The data compression apparatus of claim 10, wherein the processor is further configured to
determine a first block scaling value for scaling of the I data block based on the first block header information, and
generate the I data scaling block by operating the I data block with the first block scaling value.

13. The data compression apparatus of claim 12, wherein the first block scaling value is determined according to:

$$\frac{2^{Q_q-1}-1}{2^{Q_{di}(G_I(k)+1)}-1}$$

where $Q_q$ denotes a number of bits to be allocated to samples after the block scaling.

14. The data compression apparatus of claim 8, wherein the processor is further configured to
determine the second maximum value among absolute values of samples in the Q data block, and
generate the second block header information using the second maximum value and a number of bits of the second padding data.

15. The data compression apparatus of claim 14, wherein the second block header information is generated according to:

$$G_Q(k) = \left\lfloor \frac{A_Q(k)}{2^{Q_{dq}}} \right\rfloor$$

where $G_Q(k)$ denotes the second block header information, $A_Q(k)$ denotes the second maximum value, and $Q_{dq}$ denotes the number of bits of the second padding data.

16. The data compression apparatus of claim 15, wherein the number of bits of the second padding data is obtained by subtracting a number of bits allocated to the second block header and one from a maximum number of bits usable for the Q data block.

17. The data compression apparatus of claim 15, wherein the processor is further configured to
determine a second block scaling value for scaling of the Q data block based on the second block header information, and
generate the Q data scaling block by operating the Q data block the second block scaling value.

18. The data compression apparatus of claim 17, wherein the second block scaling value is determined according to:

$$\frac{2^{Q_q-1}-1}{2^{Q_{dq}(G_Q(k)+1)}-1}$$

where $Q_q$ denotes a number of bits to be allocated to samples after the block scaling.

19. A method of data compression, the method comprising:
storing received in-phase (I) data and quadrature (Q) data, and dividing and outputting each of stored I data and Q data on a block basis;

extracting block header information using a maximum value obtained from an I data block and a Q data block generated by dividing the I data and the Q data on the block basis and padding data;

scaling an I data scaling block and a Q data scaling block obtained by performing block-scaling on the I data block and the Q data block based on the block header information;

generating compressed data using a block header based on the block header information, the I data scaling block, and the Q data scaling block;

determining a maximum among absolute values of samples in the I data block and Q data block; and generating the block header information from the maximum value using a number of bits of the padding data, wherein the block header information is determined according to:

$$G(k) = \left\lfloor \frac{A(k)}{2^{Q_d}} \right\rfloor$$

where G(k) denotes the block header information, A(k) denotes the maximum value, and $Q_d$ denotes the number of bits of the padding data.

* * * * *